United States Patent [19]
Bae et al.

[11] Patent Number: 5,741,625
[45] Date of Patent: Apr. 21, 1998

[54] PROCESS FOR FORMING FINE PATTERNS IN A SEMICONDUCTOR DEVICE UTILIZING MULTIPLE PHOTOSENSITIVE FILM PATTERNS AND ORGANIC METAL-COUPLED MATERIAL

[75] Inventors: Sang Man Bae; Seung Chan Moon, both of Kyoungki-do, Rep. of Korea

[73] Assignee: Hyundai Electronics Industries Co., Ltd., Kyoungki-Do, Rep. of Korea

[21] Appl. No.: 659,741

[22] Filed: Jun. 6, 1996

Related U.S. Application Data

[62] Division of Ser. No. 337,281, Nov. 10, 1994, abandoned.

[30] Foreign Application Priority Data

| Nov. 10, 1993 | [KR] | Rep. of Korea | 1993-23822 |
| Nov. 15, 1993 | [KR] | Rep. of Korea | 1993-24235 |
| Nov. 17, 1993 | [KR] | Rep. of Korea | 1993-24497 |

[51] Int. Cl.$^6$ .............................. G03F 7/38; G03F 7/40
[52] U.S. Cl. ........................................... 430/312; 430/313
[58] Field of Search ................................ 430/312, 313, 430/314, 315, 316

[56] References Cited

U.S. PATENT DOCUMENTS

| 4,613,398 | 9/1986 | Chiong et al. | 430/314 |
| 5,032,491 | 7/1991 | Okumura et al. | 430/314 |
| 5,262,282 | 11/1993 | Hieda et al. | 430/314 |

*Primary Examiner*—Christopher G. Young
*Attorney, Agent, or Firm*—Merchant Gould Smith Edell Welter & Schmidt

[57] ABSTRACT

There are disclosed processes for forming fine patterns on a semiconductor substrate to a lesser degree than the resolving power of a step and repeat used, thereby improving the degree of integration of the semiconductor device. The process comprises the steps of: forming a first light-exposure mask and a second light-exposure mask with interlaced patterns selected from a plurality of fine patterns to be formed on a semiconductor substrate; coating an organic material layer on the semiconductor substrate; patterning the organic material layer by use of the first light-exposure mask, to form organic material layer patterns; forming a photosensitive film over the organic material layer patterns; and patterning the photosensitive film by use of the second light-exposure mask to form photosensitive film patterns, in such a way that each of photosensitive film patterns is interposed between two adjacent organic material layer patterns.

4 Claims, 15 Drawing Sheets

PROCESS FOR FORMING FINE PATTERNS IN A SEMICONDUCTOR DEVICE UTILIZING MULTIPLE PHOTOSENSITIVE FILM PATTERNS AND ORGANIC METAL-COUPLED MATERIAL

This is a Divisional of U.S. patent application Ser. No. 08/337,281, filed Nov. 10, 1994 now abandoned.

BACKGROUND OF THE INVENTION

1. Field of the Invention

The present invention relates, in general, to processes for the fabrication of a semiconductor device and, more particularly, to processes for forming fine patterns on a semiconductor substrate to a smaller degree than the resolving power of a step and repeat used, thereby improving the degree of integration of a semiconductor device.

2. Description of the Prior Art

In the last few years, semiconductor devices have been so highly integrated as to accommodate as many circuit devices as possible and thus, as to store more data and process more information. The high integration of a semiconductor device is largely dependent on whether circuit devices and wiring for connection of the circuit devices are precisely formed in as narrow regions as possible. For formation of the circuit devices and the wiring, it is required that photosensitive film patterns used as masks in etching and ion implantation be precisely formed. Such photosensitive film patterns are usually formed by a series of steps comprising coating of photosensitive film, exposure to light, and development. In the light-exposure step, a phototransfer apparatus or a step and repeat (hereinafter referred to as "stepper") is used to irradiate a light on an area of photosensitive film which is selectively exposed through a light-exposure mask.

Therefore, the stepper is an important factor to finely separate the photosensitive film patterns from each other. The resolving power of the stepper is said to be a scale of the degree of fineness to which the pattern by the stepper is formed. Since the resolving power of the stepper is determined by the wavelength of a beam of light irradiated on the photosensitive film and the diameter of a lens equipped in the stepper, it is difficult to reduce the resolving power to below a certain limit, a critical point. Owing to this limitation of the resolving power in the stepper, the photosensitive film patterns could not be formed more finely than below the critical point. Neither could the circuit devices and the wiring. Consequently, the degree of integration of the semiconductor device cannot overcome the limitation of the resolving power and cannot be raised over the critical point by a conventional process depending only upon steppers.

In order to better understand the background of the present invention, a description is given for conventional processes with reference to the drawing.

Referring first to FIG. 1, there is illustrated a light-exposure step of the conventional process for forming a fine pattern. As shown in this figure, a semiconductor device has a semiconductor substrate 10 on which an object material of etch 12 and a photosensitive film 14 are laminated sequentially. The photosensitive film is prepared by uniformly coating a photosensitive solution comprising a photosensing agent and a resin over a surface of the objective material of etch 12, in a spin-coat or spray manner.

Thereafter, the photosensitive film 14 is divided by a beam of light which is selectively irradiated thereon through a light-exposure mask 20, into a pattern region and a non-pattern region. The light-exposure mask 20 is prepared by forming photointerceptive film patterns 18 on a quartz substrate 16. Typical photointerceptive film patterns are made of chrome. In such light-exposure step, the photointerceptive film patterns 18 are of larger size than the light resolving power of the stepper.

Meanwhile, the photosensitive film on the non-pattern region is taken off by a weak alkaline developing solution comprising tetramethylammonium hydroxide as a main component, so as to form photosensitive film patterns.

Such photosensitive film patterns as are formed by the above conventional light-exposure step have difficulty in forming fine pattern owing to many restrictive factors, such as accuracy of the stepper, wavelength of the beam and the like. For example, they could not be formed more finely than below 0.4 μm of distance between two adjacent patterns.

In some detail, the resolving power of the stepper is represented by the general formula:

$$R = k \times \lambda / NA$$

wherein k is a process constant,
λ is a wavelength of a beam, and
NA is a constant related with the diameter of the lens of the stepper.

In the formula, the parameters, such as the wavelength of light, the diameter of lens and the process constant, cannot be reduced below their own limit values, restricting the resolving power of the stepper within a limit value. For the example, with process resolving power of a stepper employing as a light source G-line, I-line and excimer laser which have a wavelength of 436, 365 and 248 nm, respectively, patterns are limited to a size of about 0.7, about 0.5 and about 0.3 μm, correspondingly.

In FIG. 1, the photointerceptive film patterns 18 are separated from one another at a distance larger than the resolving power of the stepper. The reason is based on the fact that if the distance between two photointerceptive film patterns is smaller than the resolving power of the stepper, there is generated diffraction of light between the photointerceptive film patterns, which causes a larger area of the photosensitive film than desired to be exposed.

In order to overstep the limit of the fine pattern formed by the process of FIG. 1, there has been suggested a multilayer photosensitive film process in which a plurality of light-exposure steps are executed repeatedly. That is, a phase-reverse masking process in which the phase of a beam is reversed, is used to reduce an exposure effect caused by interference of another beam of light passing through an adjacent pattern, and a top surface imaging (hereinafter referred to as "TSI") process which comprises a plasma etching step wherein a relatively hard top layer coupled with an organic metal material is formed partially over the surface of photosensitive film, is utilized to form photosensitive film patterns.

However, the multilayer photosensitive film process has such a disadvantage that a formation step for the pattern of photosensitive film is complicated. Likewise, in the phase-reverse masking process, a formation step for the pattern of the light-exposure mask is complicated. In addition, the multilayer photosensitive film process and the phase-reverse masking process demand additional equipments which is costly to operate, thereby increasing production cost.

Meanwhile, the TSI process comprises a diffusion enhanced silylated resist (hereinafter referred to as "DESIRE") process in which a surface layer of a photosensitive film is selectively exposed and silicon is permeated into the exposed area of the surface layer. In the DESIRE process, it is required that a beam of light with small energy be irradiated so carefully on the photosensitive film for a very short time as to selectively expose only the surface layer of the photosensitive film. The DESIRE step, however, has trouble in controlling the exposure time precisely, to which the exposed area of the photosensitive film is larger than desired. As a result, the TSI process has serious difficulty in forming fine patterns of photosensitive film.

Now, a description will, in detail, be made for the DESIRE process in conjunction with its problems.

Referring to FIG. 2, there is shown a cross section of a semiconductor device illustrating the DESIRE process. As shown in FIG. 2, the semiconductor device has a semiconductor substrate 10 on which an object material of etch 12 and a photosensitive film 14 are sequentially laminated. The surface layer of the photosensitive film 14 is selectively exposed to a beam of light with a short wavelength of 248 nm passing through a light-exposure mask 20. This light-exposure mask is comprised of a quartz substrate 16 and a chrome pattern layer 18 atop the quartz substrate 16. Then, the photosensitive film 14 is contacted with an organic metal material gas containing silicon and permeated therewith, to form a silylation layer 22 consisting of silicon. At the moment, the silylation layer formed on the light-exposed area of the photosensitive film 14 is thicker than that formed on the non-exposed area of the photosensitive film 14 due to differences in diffusion rate and reaction rate with silicon between the exposed area and the non-exposed area. In addition, in the silylation layer 22 formed on the exposed area of the photosensitive film 14, a central portion is thicker than any other portion, and as the distance from the central portion is farther, the thickness of the silylation layer is thinner. Further, the silylation layer 22 has a hard structure more resistant to plasma than that of the photosensitive film 14.

Subsequently, the areas of the photosensitive film 14 without silicon ale removed by means of oxygen plasm to a degree that the object material layer of etch 12 is selectively exposed with the silylation layer 22 serving as a mask. Thus, photosensitive film patterns are formed. Thereafter, an etching step or ion implantation step is applied to the object material layer of etch 12 exposed through the mask of the photosensitive film pattern. Following completion of the etching or ion implantation step, another etching step is undertaken to eliminate the photosensitive film patterns by use of an oxygen plasma, an organic solvent or an organic acid solvent.

Such conventional DESIRE process requires a light-exposure step in which a beam of light with small energy is used to divide a photosensitive film into a pattern region and a non-pattern region. This is because use of a beam of light with large energy may cause the silylation layer to be formed even on such non-exposed areas as should not be patterned, and thus, precise pattern formation is impossible. Accordingly, in order to keep the exposure energy of light low, it is necessary to reduce the exposure time to some degree. For example, for a fine pattern of not more than 0.5 μm, the exposure time should be maintained below 200 msec. However, it is very difficult to control the exposure time in such low levels.

Although finer patterns could be formed by the DESIRE process than by other conventional processes, it also has a limit as mentioned previously. In addition, since the silylation layer is formed in a shape of circular arc in the DESIRE process, the width of the pattern is difficult to control. It is revealed that the formation of a fine pattern with a width of not more than 0.3 μm is almost impossible with the DESIRE process.

As apparent from the fact that fineness in a photosensitive film pattern has a close relation with the degree of integration of a semiconductor device, the conventional processes are limited in improving the degree of integration.

SUMMARY OF THE INVENTION

Therefore, an object of the present invention is to overcome the above problems encountered in prior arts and to provide processes for forming fine patterns on a semiconductor device, capable of overcoming the limit of resolving power of a stepper used, thereby raising the degree of integration of a semiconductor device.

In accordance with an aspect of the present invention, the above object can be accomplished by providing a process for forming fine patterns on a semiconductor device, which is comprised of steps for: forming a first light-exposure mask and a second light-exposure mask with interlaced patterns selected from a plurality of fine patterns to be formed on a semiconductor substrate; coating an organic material layer on the semiconductor substrate; patterning the organic material layer by use of the first light-exposure mask to form organic material layer patterns; forming a photosensitive film over the organic material layer patterns; and patterning the photosensitive film by use of the second light-exposure mask to form photosensitive film patterns, in such a way that each of photosensitive film patterns is interposed between two adjacent organic material layer patterns.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 1:
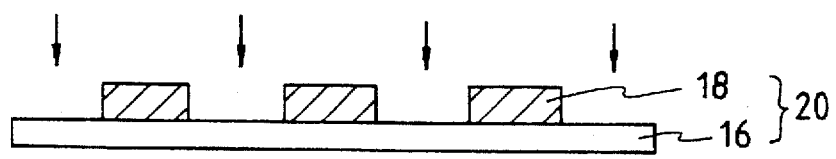
FIG. 1 is a schematic cross sectional view illustrating a conventional process for forming fine patterns on a semiconductor device.
Figure 1:
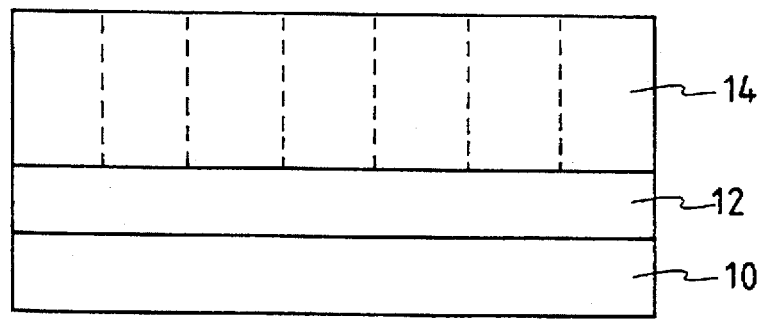
Figure 2:
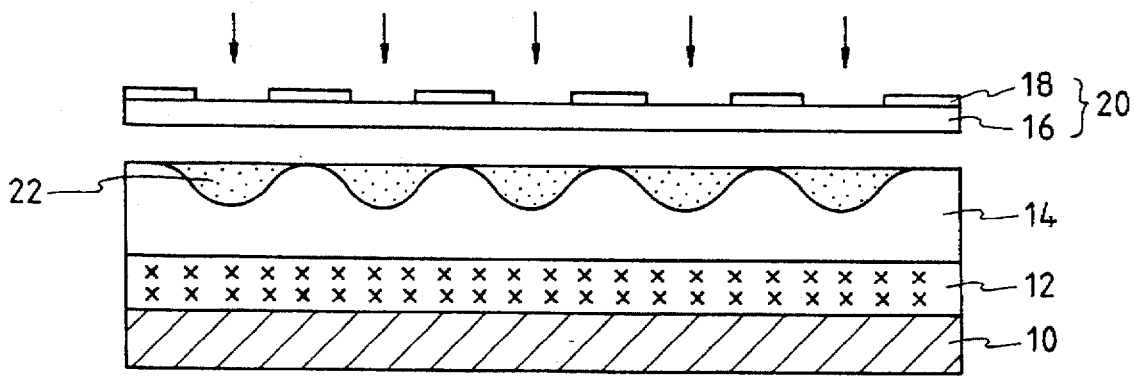
FIG. 2 is a schematic cross sectional view illustrating a DESIRE process in a conventional process for forming fine patterns on a semiconductor device.

The application of the preferred embodiments of the present invention is best understood by referring to the accompanying drawings, wherein like reference numerals are used for like and corresponding parts, respectively.

Figure 3A:
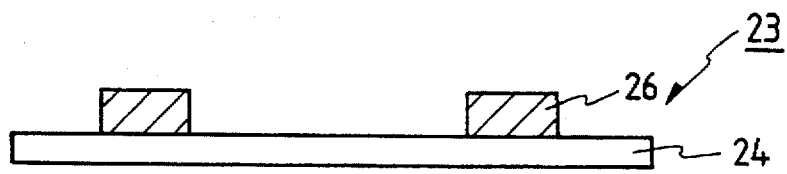
FIGS. 3A through 3F are schematic cross sectional views illustrating process steps for forming fine patterns on a semiconductor device, according to a first embodiment of the present invention.
Figure 3B:
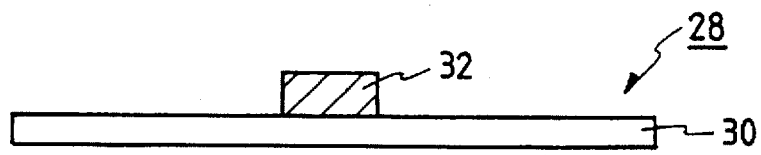

Referring to FIGS. 3A and 3B, there are shown cross sections of light-exposure masks useful for a formation process for fine patterns on a semiconductor device, according to an embodiment of the present invention.

First, in FIG. 3A, there is shown a first light-exposure mask 23 comprising a first transparent substrate 24 on which first photointerceptive film patterns 26 are formed. While the first transparent substrate 24 is made of quartz, the first photointerceptive film patterns 26 are made of chrome.

In FIG. 3B, there is shown a second light-exposure mask 28 comprising a second transparent substrate 30 on which a second photointerceptive film pattern 32 is formed. Likewise, the second transparent substrate 30 and the second photointerceptive film pattern 32 are made of quartz and chrome, respectively. The second photointerceptive film pattern 32 is positioned at the central portion between the first photointerceptive film patterns 26 so as not to overlap the first photointerceptive film patterns 26 with the second photointerceptive film pattern 32. At the moment, the first and the second photointerceptive film patterns 26, 32 are aligned in such a way that the area of the first and the second transparent substrates 24, 30 through which a beam of light passes is as large as possible. In other words, a diffraction phenomenon of light must not occur by separating the first and the second patterns therefrom as far as possible.

With reference to FIGS. 3C through 3F, there is illustrated a process for forming fine patterns of a semiconductor device, according to a first embodiment on a the present invention.

Figure 3C:
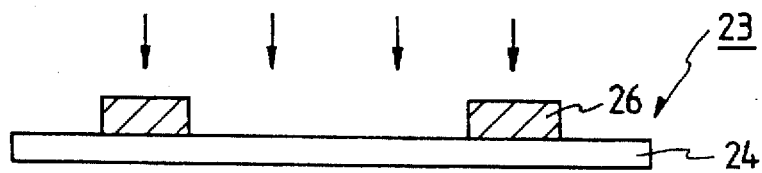
Figure 3C:
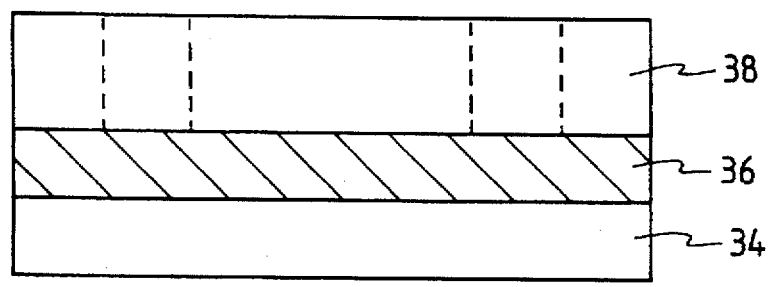

First, as shown in FIG. 3C, a light is irradiated, as indicated by arrows, through the first light-exposure mask 23 of FIG. 3A into a semiconductor device comprising a lower layer 34 on which an organic material layer 36 and a first photosensitive film 38 are sequentially formed. The lower layer 34 is atop a semiconductor substrate (not shown). As a result, the first photosensitive film 38 is selectively exposed to the beam. In the meantime, the organic material layer 36 serves as a reflection-protective layer.

Figure 3D:
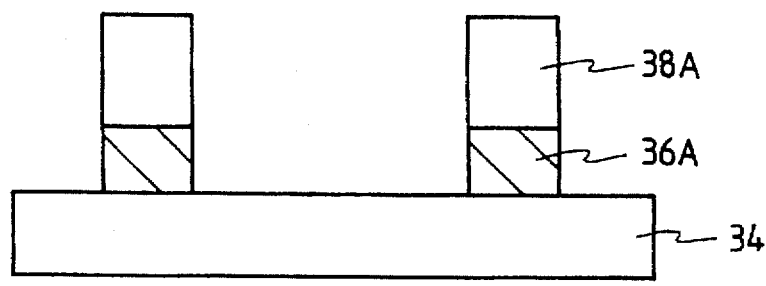

Thereafter, the light-exposed areas of the first photosensitive film 38 are removed, to form first photosensitive film patterns 38A through which the organic material layer 36 is partially exposed, as shown in FIG. 3D. Then, an etching step is undertaken to take off the organic material layer 36 exposed partially through the first photosensitive film patterns 38A, to form organic material layer patterns 36A which, in turn, expose the lower layer 34 selectively therethrough.

Figure 3E:
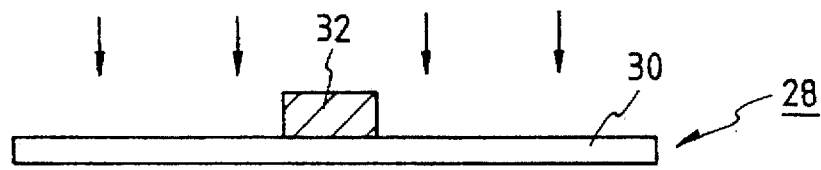
Figure 3E:
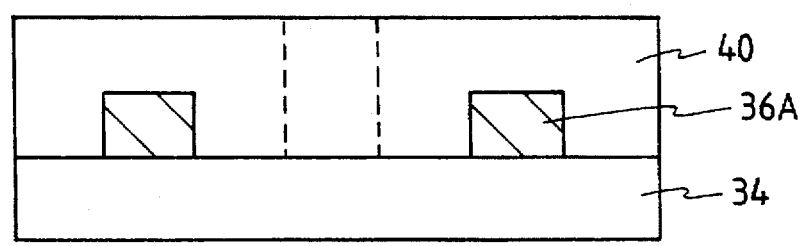

Following formation of the organic material layer patterns 36A, the first photosensitive film patterns 38A are eliminated, and a second photosensitive film 40 is coated entirely over the resulting structure, as shown in FIG. 3E. The second photosensitive film 40 is exposed to a beam of light irradiated as indicated by arrows. At this time, the second light-exposure mask 28 of FIG. 3B causes the second photosensitive film 40 to be exposed selectively.

Figure 3F:
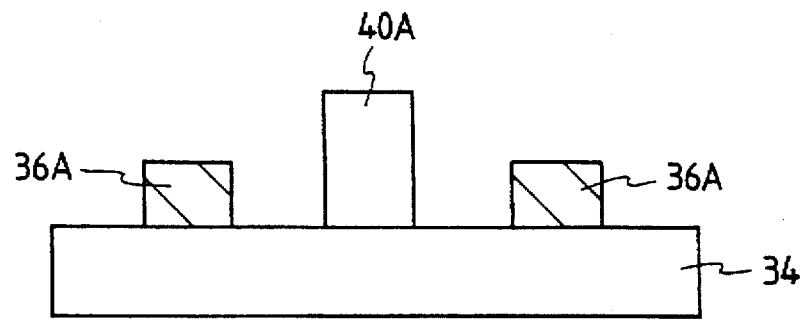

Finally, for formation of a second photosensitive film pattern 40A, all areas of the second photosensitive film but the masked one are removed so as to bare the organic material layer pattern 40A completely, as shown in FIG. 3F. As mentioned above, the second photointerceptive film pattern 32 is positioned at the central portion between the first photointerceptive film patterns 26 so as not to overlap the first photointerceptive film patterns 26 with the second photointerceptive film pattern 32. Based on this position structure, the second photosensitive film pattern 40A is interposed between the organic material layer patterns 36A. All of the second photosensitive film patterns 40A and the organic material layer pattern 36A play a role of a mask for the fine pattern which exposes the lower layer 34 selectively therethrough.

Referring now FIGS. 4A through 4E, there is illustrated a step process for forming fine patterns on a semiconductor device, according to a second embodiment of the present invention.

Figure 4A:
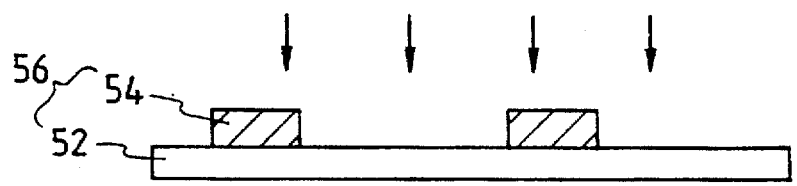
FIGS. 4A through 4E are schematic cross sectional views illustrating process steps for forming fine patterns on a semiconductor device, according to a second embodiment of the present invention.
Figure 4A:
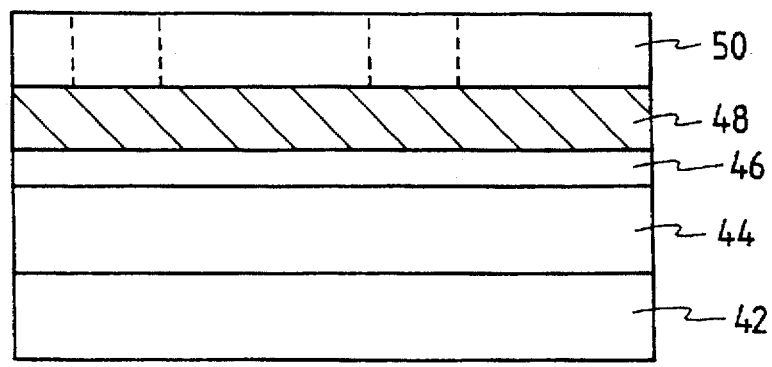

First, as shown in FIG. 4A, a beam of light is irradiated, as indicated by arrows, through a first light-exposure mask 56 into a semiconductor device comprising a lower layer 42 on which a first photosensitive film 44, an intermediate layer 46, an organic material layer 48 and a second photosensitive film 50 are sequentially formed. As a result, the second photosensitive film 50 is selectively exposed to the beam. The lower layer 42 which is formed on a semiconductor substrate (not shown) is an object material of pattern. The intermediate film 46 is formed of a spin-on-glass (hereinafter referred to as "SOG") film. In the meantime, the organic material layer 48 serves as a reflection-protective layer. With regard to the first light-exposure mask 56, it comprises a first transparent substrate 52 made of quartz on which first photointerceptive film patterns 54 are formed of chrome.

Figure 4B:
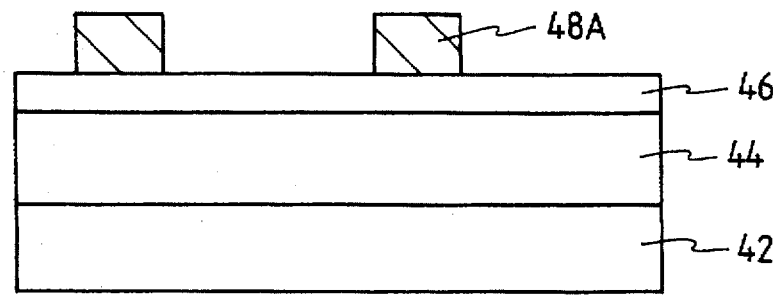

Next, the exposed areas of the second photosensitive film 50 are eliminated, to form second photosensitive film patterns (not shown) through which the organic material layer 48 is selectively exposed, followed by selective removal of the exposed areas of the organic material layer 48. For this selective removal, an etching step is carried out. At least, organic material layer patterns 48A result. After formation of the organic material layer patterns 48A, the second photosensitive film patterns atop the organic material layer patterns 48A are eliminated, as shown in FIG. 4B. In turn, the organic material layer patterns 48A expose the intermediate layer 46 selectively therethrough.

Figure 4C:
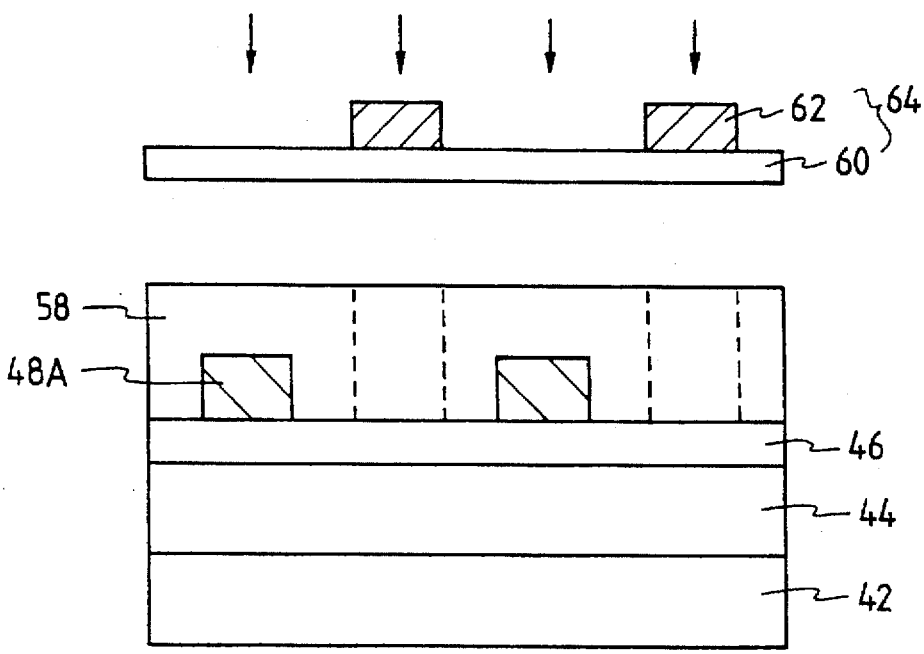

Over the resulting structure, there is coated a third photosensitive film 58, that is then selectively exposed to a beam of light passing through a second light-exposure mask 64, as shown in FIG. 4C. The second light-exposure mask 64 is comprised of a second transparent substrate 62 made of quartz and second photointerceptive film patterns 64 atop the second transparent substrate 60. Each of the second photointerceptive film patterns 62, made of chrome, is positioned between two adjacent first photointerceptive film patterns 54 so that they might not overlap with each other. In order not to generate a diffraction phenomenon of light, the first photointerceptive film patterns 54 are separated from each other at a great distance relative to the wavelength of the beam. Likewise, in the second photointerceptive film patterns 62, the distance between two adjacent patterns is so very large relative to the wavelength of the beam as to prevent the diffraction phenomenon of light.

Figure 4D:
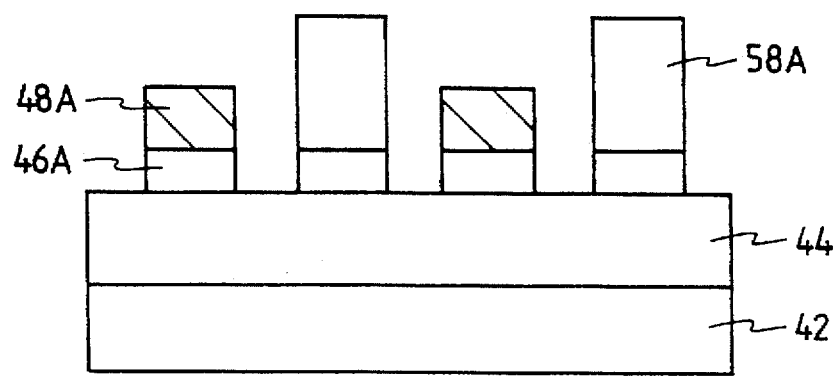

Thereafter, the exposed areas of the third photosensitive film 58 are eliminated, to form third photosensitive film patterns 58A, each of which is interposed between the organic material layer patterns 48A atop the intermediate layer 46, as shown in FIG. 4D. As a result, the third photosensitive film patterns 58A along with the organic material layer patterns 48A are used as a mask for the fine pattern through which the intermediate layer 46 is selectively exposed. An etching step is undertaken to remove the exposed areas of the intermediate layer 46, and thus, to form intermediate layer patterns 46A which, in turn, expose the first photosensitive film selectively therethrough.

Figure 4E:
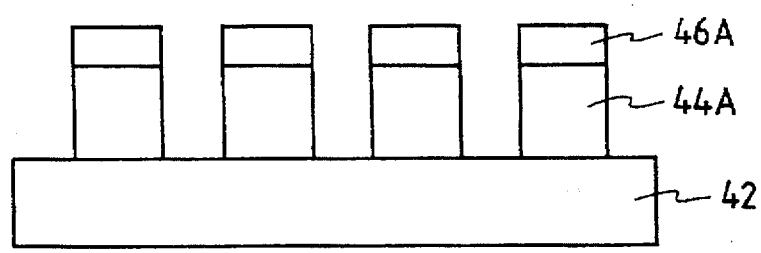

Using O₂ plasma, the first photosensitive film 44 exposed through the intermediate layer pattern 46A is etched selectively, to form first photosensitive film patterns 44A, as shown in FIG. 4E. During this etch, the third photosensitive film patterns 58A and the organic material layer patterns 48A are removed by the O₂ plasma, as well. At the moment, the intermediate layer patterns 46A are used as an etch stopper which prevents etching of the first photosensitive film patterns 44A thereunder.

As a result, the first photosensitive film patterns 44A expose the surface of the lower layer 42 not only selectively but also minutely. The intermediate layer patterns 46A and the first photosensitive film patterns 44A have a very fine pattern structure effected by the cooperation of the first photointerceptive film patterns 54 and the second photointerceptive film patterns 62. Accordingly, the lower layer 42 can be patterned finely by an etching step employing the first photosensitive film patterns 44A as a mask.

With reference to FIGS. 5A through 5G, there is illustrated a process for forming a fine pattern of semiconductor device, according to a third embodiment of the present invention.

Figure 5A:
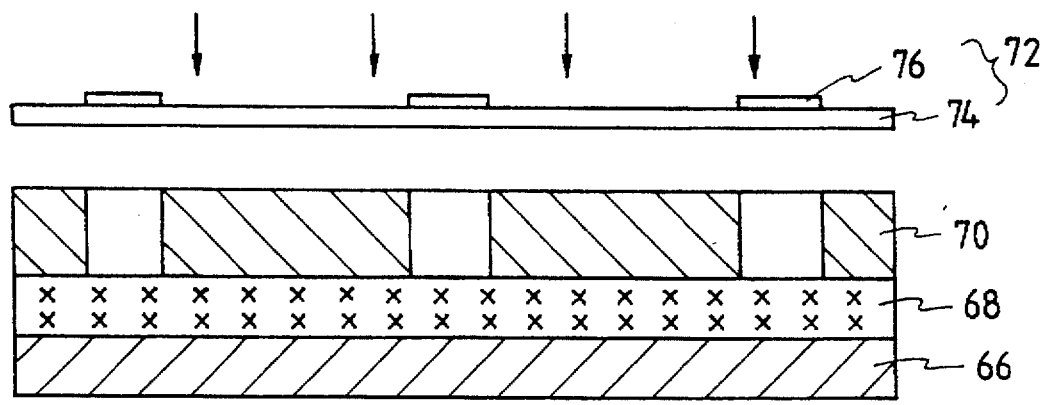
FIGS. 5A through 5G are schematic cross sectional views illustrating process steps for forming fine patterns on a semiconductor device, according to a third embodiment of the present invention.

In FIG. 5A, there is a semiconductor device comprising a semiconductor substrate 66 on which a polysilicon layer 68 and a first photosensitive film 70 are formed, in due order. The first photosensitive film 70 is prepared by coating the polysilicon layer 68 with a positive photosensitive solution in which non-exposed areas are to be patterned. Then, the first photosensitive film 70 is exposed to a beam of light through a first light-exposure mask 72, to define areas to be patterned. The first exposure mask 72 consists of a quartz substrate 74 and first photointerceptive film patterns 76 atop the quartz substrate 74.

In accordance with the present invention, the first photointerceptive film patterns 76 are twice as sparse as object photosensitive film patterns to be formed. For example, if the object photosensitive film patterns have 0.4 μm of unit pitch consisting of 0.2 μm of the width of a pattern and 2.0 μm of the distance between two adjacent patterns, the first photointerceptive film patterns 76 of the first exposure-mask 72 have 0.8 μm of unit pitch consisting of the same width of the pattern and 0.6 μm of the distance between two adjacent patterns. Therefore, there is scarcely generated a diffraction phenomenon of light in the present photointerceptive film patterns.

Figure 5B:
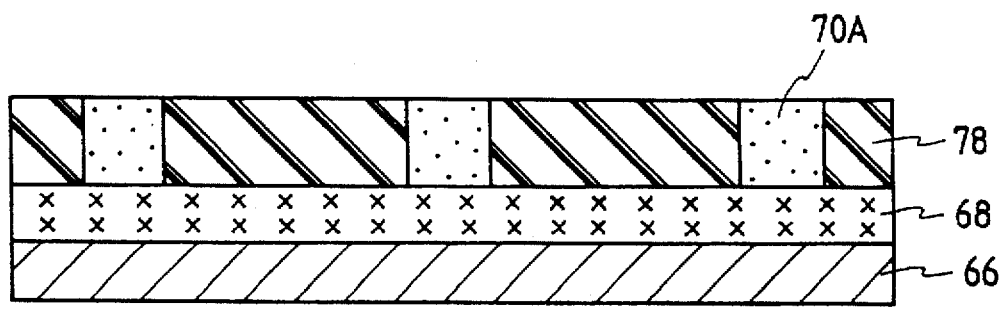

Thereafter, the first photosensitive film 70 is contacted with an organic metal material containing silicon, to form a silylation layer 78 and first photosensitive film patterns 70A, as shown in FIG. 5B. The formation of the silylation layer 78 is accomplished by permeation of silicon atoms into the exposed area of the first photosensitive film 70, defining the first photosensitive film patterns 70A. Following completion of this formation, the silylation layer 78 and the first photosensitive film patterns 70A are subjected to thermal treatment.

Figure 5C:
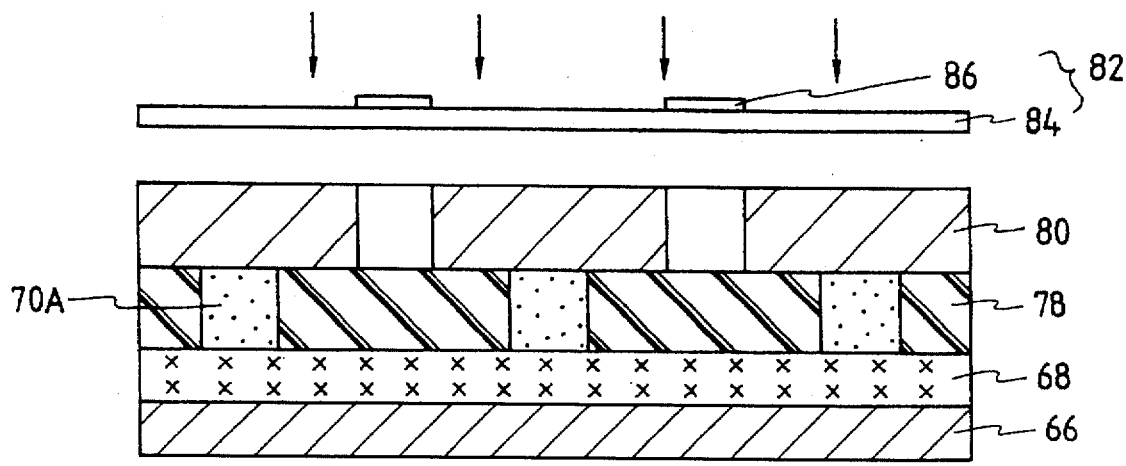

Subsequently, a positive photosensitive solution is coated on the silylation layer 78 and the first photosensitive film patterns 70A, to form a second photosensitive film 80, which is, in turn, exposed selectively to a beam of light passing through a second light-exposure mask 82, as shown in FIG. 5C. This selective light-exposure divides the second photosensitive film into non-exposed areas to be patterned and exposed areas to be removed.

With regard to the second light-exposure mask 82, it comprises a second quartz substrate 84, and photointerceptive film patterns 86 atop the quartz substrate 84. The second photointerceptive film patterns 86 in the second light-exposure mask 82 are alternated with the first photointerceptive film patterns 76 in the first light-exposure mask so as not to overlap the former with the latter. That is, the second photointerceptive film patterns 86 with, for example, 0.8 μm of unit pitch consisting of 0.2 μm of pattern width and 0.6 μm of the distance between two adjacent patterns and the first photointerceptive film patterns 76 having the same dimensions are positioned alternatively.

Figure 5D:
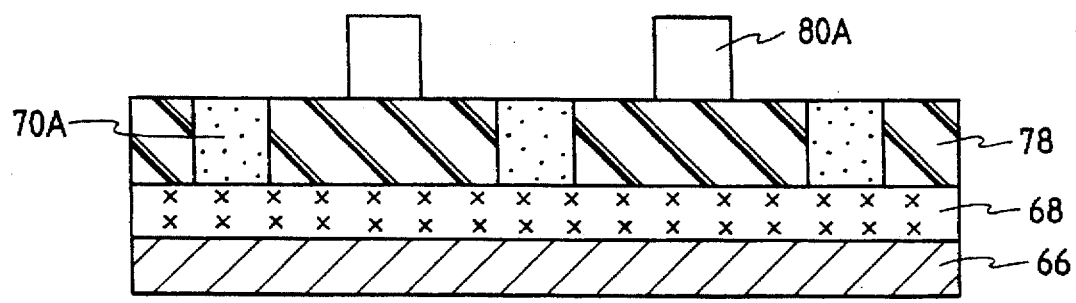

As shown in FIG. 5D, the exposed areas of the second photosensitive film 80 are eliminated to form second photosensitive film patterns 80A. Through the second photosensitive film patterns 80A, the first photosensitive film patterns 70A are bared completely and the silylation layer 78 is exposed in part.

Figure 5E:
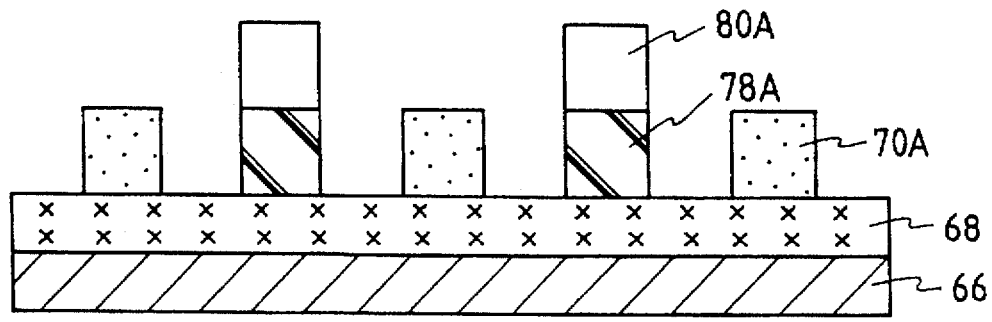

Next, the silylation layer 78 exposed partially through the second photosensitive film patterns 80A is subject to anisotropic etch in a reactive ion etching manner, to form silylation layer patterns 78A through which the polysilicon layer 68 is selectively exposed, as shown in FIG. 5E. At this moment, the reactive ion etch is executed in such a short time as not to take off the first photosensitive film patterns 70A. As a result, the desired dimension of fine pattern can be obtained. For example, the silylation patterns 78A underneath the second photosensitive film patterns 80A and the first photosensitive film patterns 70A both constitute fine patterns having 0.4 μm of unit pitch consisting of 0.2 μm of pattern width and 0.2 μm of distance.

Figure 5F:
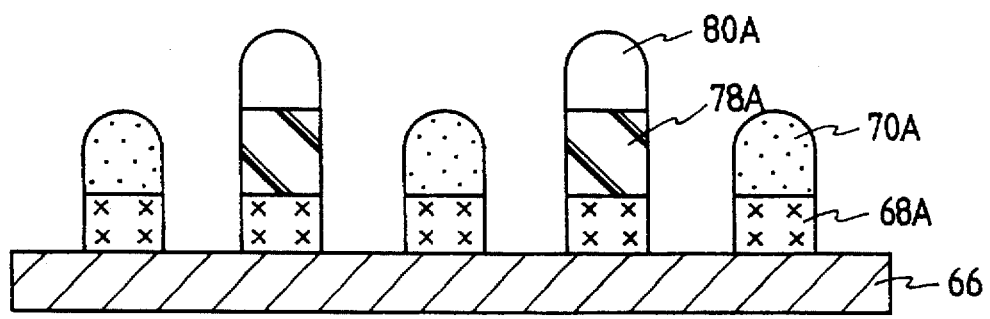
Figure 5G:
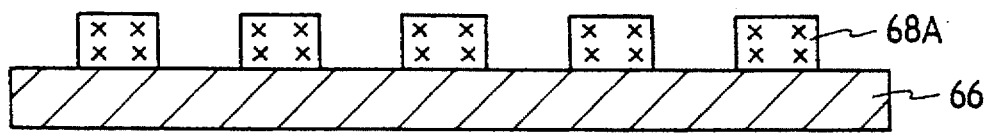

A usual anisotropic etching process is applied to the polysilicon layer 68 exposed selectively through the first and the second photosensitive film patterns 70A and 80A, to form polysilicon layer patterns 68A which, in turn, expose the semiconductor substrate 66 selectively therethrough, as shown in FIG. 5F.

Finally, the first photosensitive film patterns 70A and the silylation layer patterns 78A, both formed on the polysilicon layer patterns 68A, are removed along with the second photosensitive film pattern 80A formed on the silylation layer patterns 78A.

Though a positive photosensitive film is exemplified in the third embodiment of the present invention, properly controlled positive/negative photosensitive solutions for the first and the second photosensitive film along with light exposure masks appropriate for the solutions may also be useful to form fine patterns.

As described above, the process according to the present invention is capable of exhibiting a resolving power of 0.35 μm or less, equal to that of I-line or excimer laser stepper, in a G-line stepper having a resolving power of 0.7 μm on process, and of accomplishing ultrafine patterns of even 0.2 μm or less with an I-line stepper having a resolving power of 0.5 μm on production process.

Turning now to FIGS. 6A through 6F, there is illustrated a step process for forming fine patterns on a semiconductor device, according to a fourth embodiment of the present invention.

First, a beam of light is irradiated, as indicated by arrows, through a first light-exposure mask 98 into a semiconductor device comprising a semiconductor substrate 88 on which a polysilicon layer 90, a first photosensitive film 92, an intermediate layer 94 and a second photosensitive film 96 are sequentially formed. As a result, the second photosensitive film 96 is selectively exposed to the light and thus divided into non-exposed areas and exposed areas. While the intermediate film 94 is prepared by coating SOG on the first photosensitive film 92, the first and the second photosensitive films 92, 96 are formed by coating a positive photosensitive solution on the polysilicon layer 90 and the intermediate layer 94 in a spin-coat and spray manner. The SOG layer 94 consists of glass materials, such as phospho silicate glass, boro phospho silicate glass, and undoped silicate glass.

With regard to the first light-exposure mask 98, it comprises a quartz substrate 100 transmissive to light on which first photointerceptive film patterns 102 are formed of chrome.

In accordance with the present invention, the first photointerceptive film patterns 102 are twice as sparse as object photosensitive film patterns to be formed. For example, if the object photosensitive film patterns have 0.4 µm of unit pitch consisting of 0.2 µm of the width of a pattern and 0.2 µm of the distance between two adjacent patterns, the first photointerceptive film patterns 102 have 0.8 µm of unit pitch consisting of the same width of the pattern and 0.6 µm of the distance between two adjacent patterns.

Figure 6A:
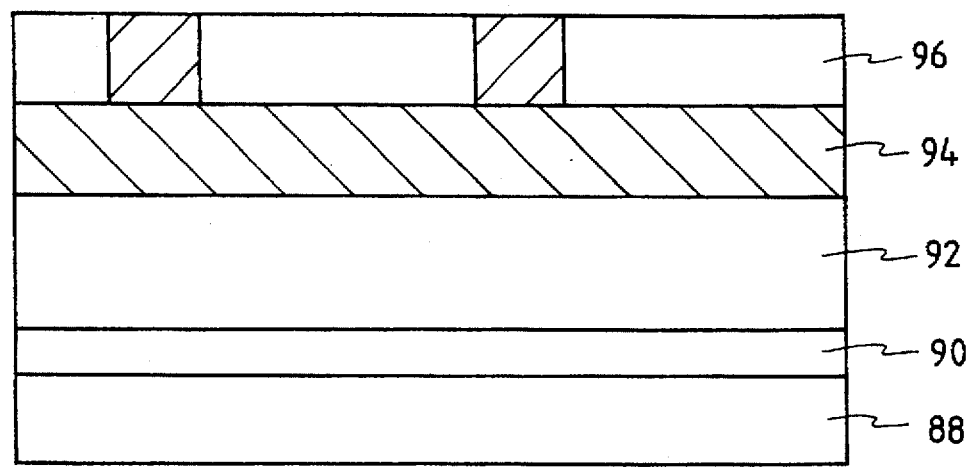
FIGS. 6A through 6F are schematic cross sectional views illustrating process steps for forming fine patterns on a semiconductor device, according to a fourth embodiment of the present invention.
Figure 6B:
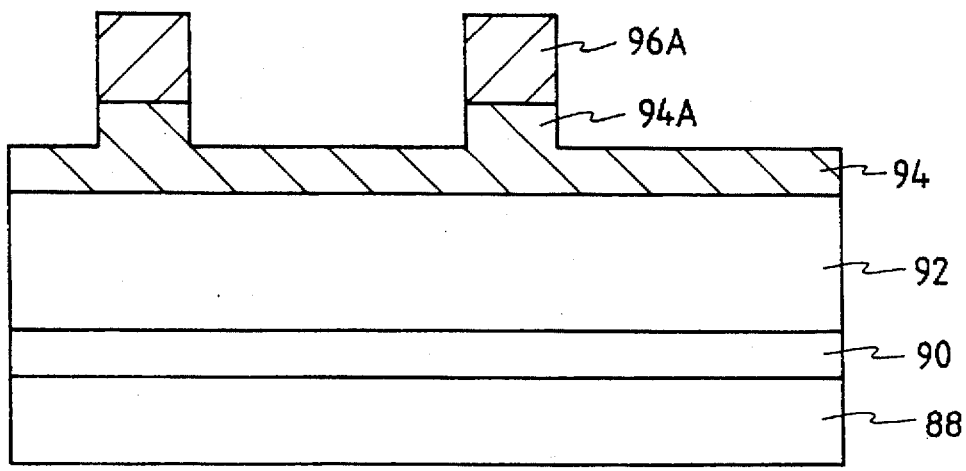

The exposed areas of the second photosensitive film 96 are taken off, to form second photosensitive film patterns 96A through which the SOG layer 94 is selectively exposed, as shown in FIG. 6B. Then, a reactive ion etching process is carried out to remove the SOG layer 94 exposed selectively by the second photosensitive film patterns 96A, at half of its total thickness, so as to form first SOG layer patterns 94A. Each of the first SOG layer patterns 94A is positioned between the residual SOG layers 94 and the second photosensitive film patterns 96A.

Figure 6C:
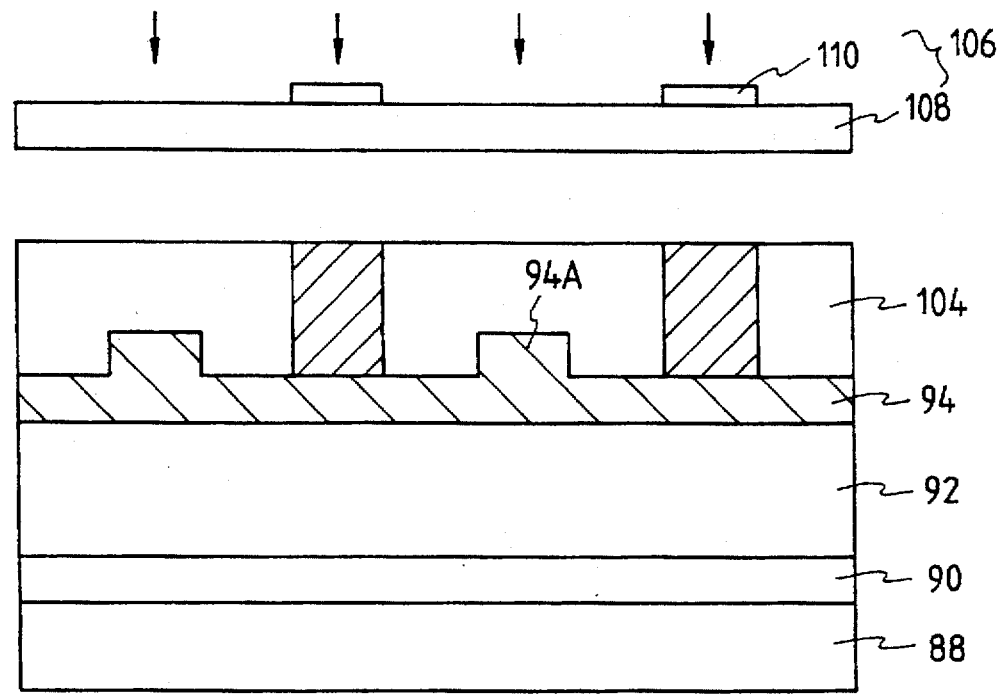

Thereafter, the second photosensitive film patterns 96A atop the first SOG layer patterns 94A are eliminated, and over the resulting structure, there is newly formed a third photosensitive film 104, as shown in FIG. 6C. A beam of light is irradiated, as indicated by arrow, through a second light-exposure mask 106 into the third photosensitive film 104 which thus is divided into exposed areas and non-exposed areas.

With regard to the second light-exposure mask 160, it is comprised of a quartz substrate 108 and second photointerceptive film patterns 110 atop the quartz substrate 108. The second photointerceptive film patterns 110 in the second light-exposure mask 106 are alternated with the first photointerceptive film patterns 102 in the first light-exposure mask so as not to overlap the formed with the latter. That is, the second photointerceptive film patterns 110 with, for example, 0.8 µm of unit pitch consisting of 0.2 µm of pattern width and 0.6 µm of the distance betweeen two adjacent patterns, and the first photointerceptive film patterns 102 having the same dimensions are positioned alternatively.

Figure 6D:
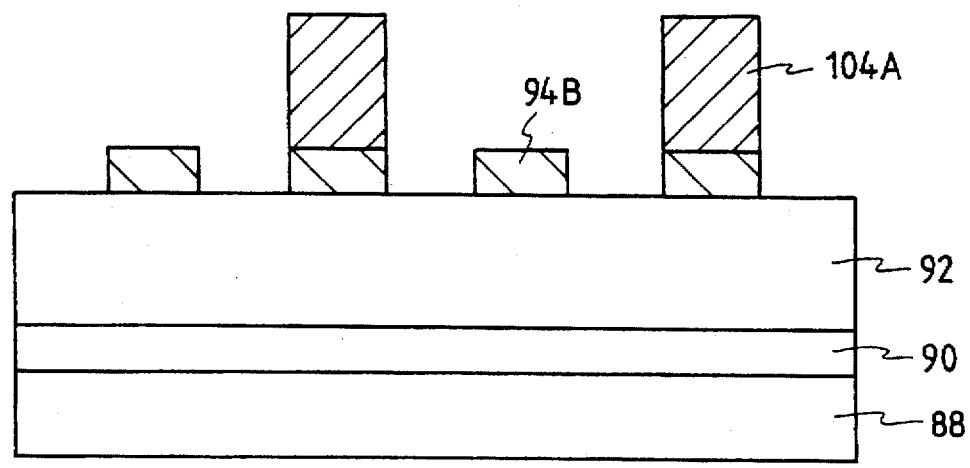

As shown in FIG. 6D, the exposed areas of the third photosensitive film 104 are removed to form third photosensitive film patterns 104A which bare the first SOG layer patterns 94A completely and expose the residual SOG layer partially therethrough, and then, the first SOG layer patterns 94A and the residual SOG layer 94 are subjected to anisotropic etch in a reactive ion etching manner, so as to form second SOG layer patterns 94B. That is, the second SOG layer patterns 94B are formed of the lower portions of the first SOG layer patterns 94A and of the residual SOG layer 94 underneath the third photosensitive film patterns 104A therethrough. These second SOG layer patterns 94B are fine patterns with, for example, 0.4 µm of unit pitch consisting of 0.2 µm of pattern width and 0.2 µm of distance between two adjacent patterns.

Figure 6E:
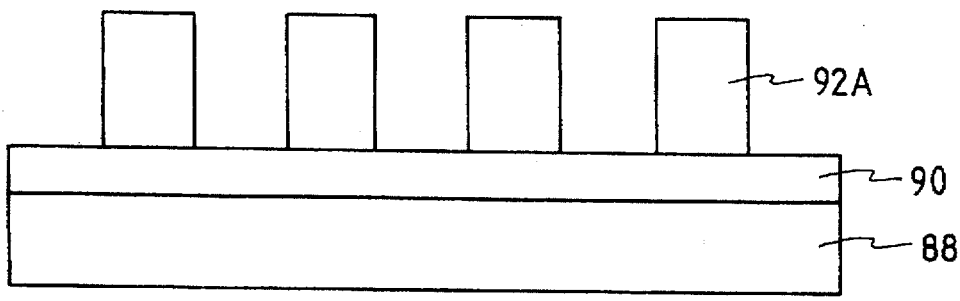

Subsequently, the third photosensitive film patterns 104A are taken off and the first photosensitive film exposed selectively through the second SOG layer patterns 92A is also removed, to form first photosensitive film patterns 92A through which the polysilicon layer 90 is selectively exposed, as shown in FIG. 6E. After completion of the formation of the first photosensitive film patterns 92A, the second SOG layer patterns 94B are eliminated.

Figure 6F:
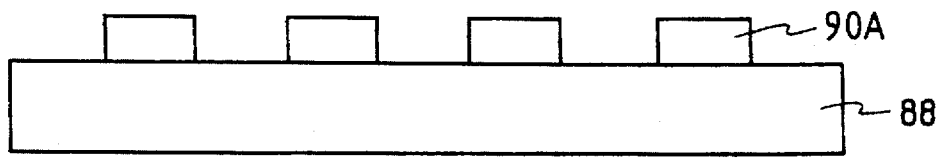

Finally, the polysilicon layer 90 is removed with the first photosensitive film patterns 92A serving as a mask, to form fine polysilicon layer patterns 90A, followed by removal of the first photosensitive film patterns 92A, as shown in FIG. 6F.

Though a positive photosensitive film is exemplified in the fourth embodiment of the present invention, properly controlled positive/negative photosensitive solutions for the first and the second photosensitive films along with light-exposure masks appropriate for these solutions may also be useful to form fine patterns.

Accordingly, the process described above is capable of exhibiting a resolving power of 0.35 µm or less, equal to that of I-line or excimer laser stepper, in a G-line stepper having a resolving power of 0.7 µm on process, and of accomplishing ultrafine patterns of even 0.2 µm or less with an I-line stepper having a resolving power of 0.5 µm on production process.

As described hereinbefore, there are used two separate light-exposure masks, each of which has an interlaced line selected from a plurality of lines contained in desired fine patterns, in accordance with the present invention. The use of the separate light-exposure masks brings about effects that light diffraction phenomenon at light-exposure mask can be prevented, and further, pattern region and non-pattern region can definitively be discriminated. In addition, sequential formation and cooperation of the patterns according to the two separate light-exposure masks can give precise formation of fine patterns. Further, the use of the two separate light-exposure masks is able to obtain a resolving power twice as good as use of one mask is, allowing very large allowance. By virtue of the improvement in resolving power and allowance, the processes according to the present invention can take advantage of a conventional stepper to precisely form fine patterns and to raise the degree of integration of a semiconductor device into above the conventional limit of, for example, 64M or 264M.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for forming fine patterns for a semiconductor device, comprising the steps of:

forming a first light-exposure mask and a second light-exposure mask with interlaced patterns selected from a plurality of fine patterns to be formed on a semiconductor substrate;

coating a first photosensitive film on an intermediate layer on a semiconductor substrate;

selectively exposing the first photosensitive film to a light by use of the first light-exposure mask having predetermined photointerceptive patterns to create an exposed area and a non-exposed area;

contacting the first photosensitive film with an organic metal material such that the exposed area of the first photosensitive film is diffused with the organic metal material to form an organic metal-coupled material and such that the non-exposed area of the first photosensitive film is not diffused therewith to form first photosensitive film patterns, the first photosensitive film becoming a layer of the organic metal-coupled material and the first photosensitive film patterns;

coating a second photosensitive film over the layer of first photosensitive film patterns and the organic metal-coupled material;

selectively exposing the second photosensitive film by use of the second light-exposure mask to form second photosensitive film patterns over the organic metal-coupled material, the second light-exposure mask having photointerceptive patterns, each of which is interposed between adjacent photointerceptive patterns of the first light-exposure mask; and taking off the selectively exposed areas of the organic metal-coupled material through the second photosensitive film patterns, to form organic metal-coupled layer patterns underneath the second photosensitive film patterns in addition to the first photosensitive film patterns in the layer of the organic metal-coupled material and the first photosensitive film patterns.

2. A process in accordance with claim 1, wherein the first photosensitive film and the second photosensitive film are independently formed of a positive photosensitive solution.

3. A process in accordance with claim 1, wherein the first photosensitive film and the second photosensitive film are independently formed of a negative photosensitive solution.

4. A process in accordance with claim 2, wherein the organic metal material contains silicon and is used to form a silylation layer.

* * * * *